United States Patent [19]
Shinohara

[11] Patent Number: 6,127,099
[45] Date of Patent: *Oct. 3, 2000

[54] METHOD OF PRODUCING A SEMICONDUCTOR DEVICE

[75] Inventor: Masahide Shinohara, Tokyo, Japan

[73] Assignee: NEC Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/634,442

[22] Filed: Apr. 18, 1996

[30] Foreign Application Priority Data

Apr. 24, 1995 [JP] Japan ..................................... 7-123184

[51] Int. Cl.$^7$ ....................................................... G03F 7/26
[52] U.S. Cl. .......................... 430/317; 430/319; 430/330
[58] Field of Search .................... 730/314, 317, 730/330, 319

[56] References Cited

U.S. PATENT DOCUMENTS

| | | | |
|---|---|---|---|
| 4,495,220 | 1/1985 | Wolf et al. | 427/82 |
| 4,606,998 | 8/1986 | Clodgo et al. | 430/312 |
| 4,705,606 | 11/1987 | Young et al. | 204/15 |
| 5,007,981 | 4/1991 | Kawasaki et al. | 156/643 |
| 5,191,403 | 3/1993 | Nakazawa | 257/787 |

FOREIGN PATENT DOCUMENTS

| | | | |
|---|---|---|---|
| 4-25047 | 1/1992 | Japan . | |
| 4-43641 | 2/1992 | Japan . | |
| 7-58107 | 3/1995 | Japan | H01L 21/3205 |

OTHER PUBLICATIONS

English Translation of JP 7–58107, Mar. 3, 1995.
English translation of JP 4043641 cited in the prior office action.
English abstracts of JP 4043641 cited on applicant's IDS (paper no. 2), JAPIO and CAPLUS abs, Feb. 1992.
English abstract of JP 4025047 cited on applicant's IDS, JAPIO abs, Jan. 1992.

*Primary Examiner*—Janet C. Baxter
*Assistant Examiner*—Rosemary Ashton
*Attorney, Agent, or Firm*—Hayes, Soloway, Hennessey, Grossman & Hage, P.C.

[57] ABSTRACT

A method of producing a semiconductor substrate, particularly one having a buffer coat layer and sealed in a mold resin, is disclosed. The method patterns a polyimide film, etches an insulating film or passivation film using the resulting polyimide pattern as a mask, and then ashes the polyimide pattern by oxygen plasma to thereby obviate the influence of an etchant used for etching. Therefore, the method is capable of reducing the corrosion of portions where a metallic wiring pattern is exposed to the outside. Because the oxygen ashing step is followed by heat treatment, the influence of oxygen which would lower the adhesion strength between the polyimide pattern and a mold resin is eliminated. As a result, tight adhesion of the polyimide pattern to the mold resin is insured. Further, when a first heat treatment is effected after the patterning of the polyimide film, a solvent in the polyimide film is evaporated. This reduces degassing in the event of the etching of the passivation film which immediately follows the first heat treatment.

6 Claims, 6 Drawing Sheets

METHOD OF PRODUCING A SEMICONDUCTOR DEVICE

BACKGROUND OF THE INVENTION

The present invention relates to a method of producing a semiconductor device, particularly one having a buffer coat layer and sealed in a mold resin.

A semiconductor device or chip having a passivation film on its surface and sealed in a mold resin is conventional. Recently, the increasing size of this type of semiconductor device has brought about a problem that a gap is formed at the interface between the passivation film and the mold resin due to a heavy stress acting therebetween, thereby deteriorating the moisture proof feature of the device, among others. To reduce stress, there has been proposed a semiconductor device having a polyimide film or buffer layer between the mold resin and the passivation film.

To produce semiconductor device chips, it is necessary that the passivation film and polyimide film be formed with openings in their portions corresponding to scribe lines and bonding pads and be separated therealong. This can be done if each of the passivation film and polyimide films is patterned through a respective mask implemented by may photoresist. Alternatively, the polyimide film may be patterned first, and then the passivation film may be patterned through the patterned polyimide film. The former method, however, needs a great number of steps which increase manufacturing time. The latter method is disclosed in, e.g., Japanese Patent Laid-Open Publication Nos. 4-025047 and 4-043641. However, the problem with this method, i.e., patterning the passivation film with the hardened polyimide film serving as a mask is that the ions of fluorine-based gas used to etch the passivation film remain on the surface of the polyimide film. The ions cause the exposed portions of Al (aluminum)-based metal to corrode due to moisture in the air. To reduce the corrosion, i.e., to remove the fluorine ions, there has been proposed a method which ashes the surface of the polyimide film by oxygen and then removes only a part of the surface by etching back. This, however, brings about another problem that oxygen for ashing dissociates the imide coupling of the polyimide surface and thereby lowers the adhesion of the polyimide to the mold resin.

SUMMARY OF THE INVENTION

It is therefore an object of the present invention to provide a method of producing a semiconductor device which is capable of protecting metallic portions from corrosion and which insures the tight adhesion of polyimide to a mold resin.

In accordance with the present invention, a method of producing a semiconductor device comprises the steps of forming a metallic wiring pattern on a semiconductor substrate, forming an insulating film on the metallic wiring pattern, forming a polyimide film on the insulating film, patterning the polyimide film to thereby form a polyimide pattern, selectively etching the insulating film by using the polyimide pattern as a mask, ashing the surface of the polyimide pattern by oxygen plasma, and causing the polyimide pattern to form an imide coupling by heat treatment.

Also, in accordance with the present invention, a method of producing a semiconductor device comprises the steps of forming a metallic wiring pattern on a semiconductor substrate, forming an insulating film on the metallic wiring pattern, forming a polyimide film on the insulating film, patterning the polyimide film to thereby form a polyimide pattern, subjecting the polyimide pattern to first heat treatment, selectively etching the insulating film by using the polyimide pattern as a mask, ashing the surface of the polyimide pattern by oxygen plasma, and subjecting the polyimide pattern to second heat treatment.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1A:
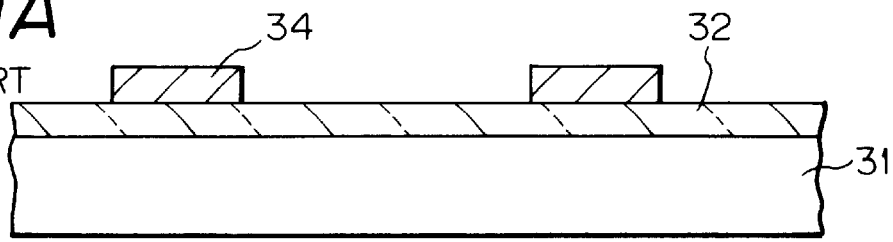
FIGS. 1A–1D are sections demonstrating a part of a conventional method of producing a semiconductor device.

To better understand the present invention, a brief reference will be made to a conventional method which treats a passivation film by using polyimide as a mask, shown in FIGS. 1A–1D. FIG. 1A shows a semiconductor substrate 31 in the form of a wafer and having devices formed thereon. First, a 500 nm high metal film is formed on the substrate 31 by sputtering with the intermediary of an insulating film 32. The metal film may be implemented by Al—Si—Cu (aluminum-silicon-cuprum) belonging to a family of Al-based alloys. Photoresist is applied to the Al—Si—Cu film by spin coating, exposed, and then developed to turn out a resist pattern. Then, the Al—Si—Cu film is subjected to reactive ion etching (RIE) using chlorine-based gas with the resist pattern serving as a mask. As a result, an Al—Si—Cu wiring pattern 34 is formed on the substrate 31.

Figure 1B:
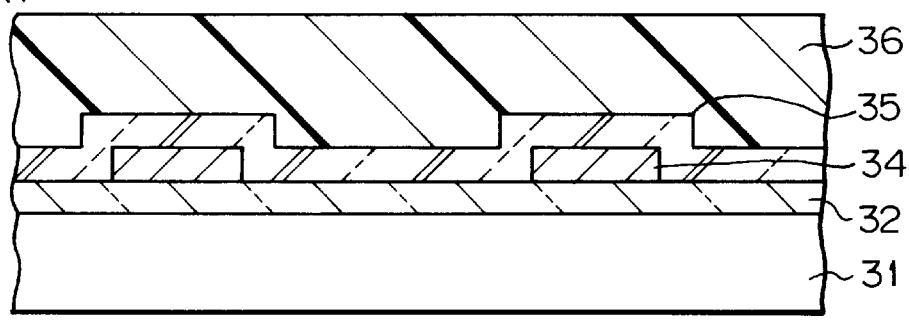
Figure 1C:
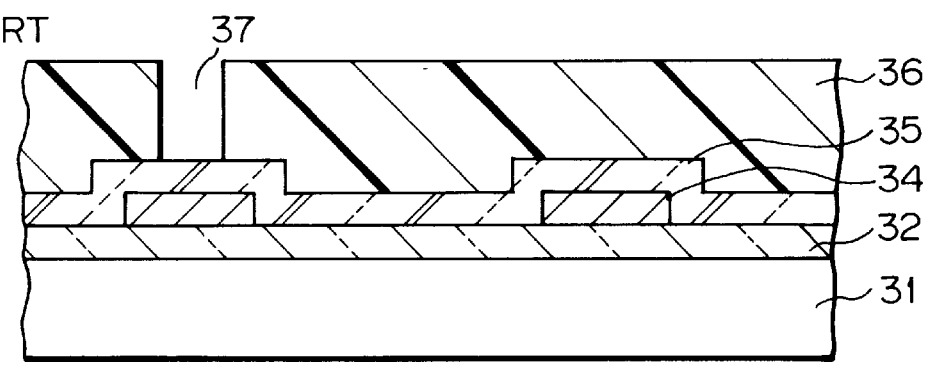
Figure 1D:
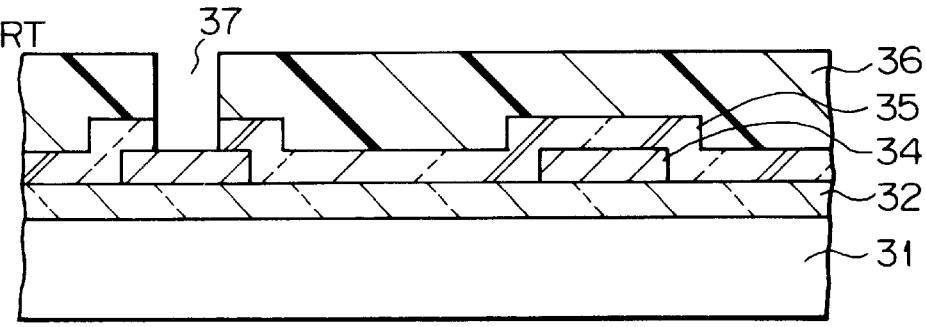

Subsequently, as shown in FIG. 1B, a 1,000 nm thick passivation film, e.g., silicone nitride (SiN) film 35 is formed on the wiring pattern 34 by CVD (Chemical Vapor Deposition). A photosensitive polyimide precursor solution is dropped onto the SiN film by spin coating, thereby forming a polyimide film 36 which is 20,000 nm thick by way of example. As shown in FIG. 1C, the polyimide film 36 is exposed, developed, and then patterned to form, e.g., an opening 37. Then, as shown in FIG. 1D, the film 36 is hardened by heat treatment under optimal conditions, e.g., at a temperature between 300° C. and 400° C. for 60 minutes to 120 minutes. Thereafter, RIE using a fluorine-based gas mixture, e.g., $CF_4$—$O_2$ mixture is effected using the hardened film 36 as a mask, thereby treating the SiN film 35.

After the above procedure, the wafer is separated into chips along a scribe line adjoining the opening 37. After the chips have each been adhered to a lead frame, bonding pads also adjoining the opening 37 and the lead frame are connected to each other. Finally, the entire assembly is sealed in a mold resin.

The above conventional procedure, however, has various problems left unsolved, as discussed earlier.

Figure 2A:
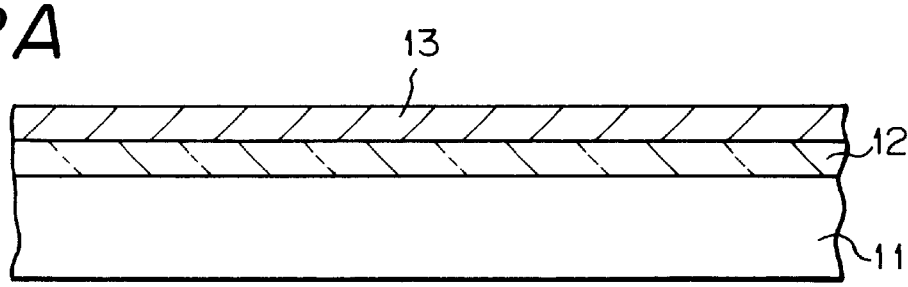
FIGS. 2A–2G are sections showing a method of producing a semiconductor device embodying the present invention.
Figure 2B:
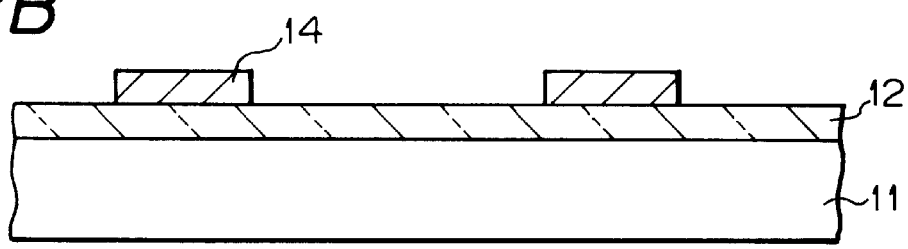
Figure 2C:
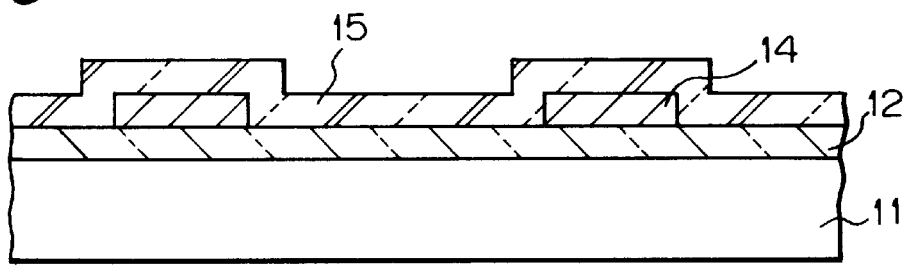
Figure 2D:
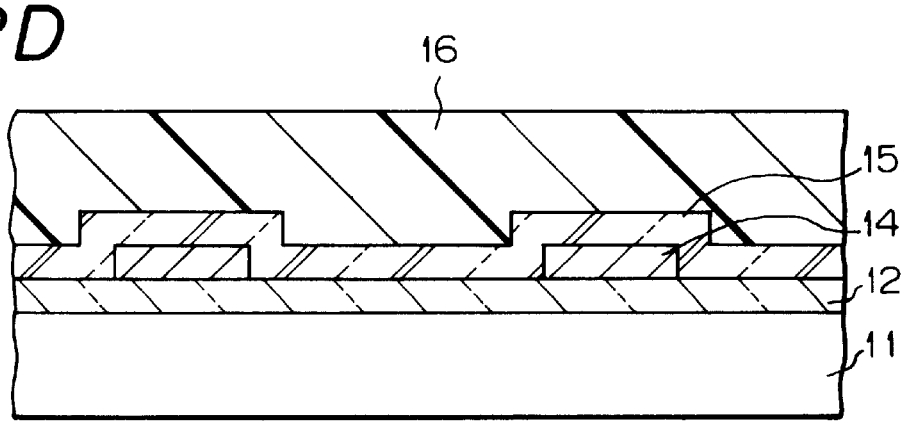

Referring to FIGS. 2A–2G a first embodiment of the method of producing a semiconductor device in accordance with the present invention will be described. As shown in FIG. 2A, an insulating film or ground layer 12 is formed on a semiconductor substrate 11 formed with devices thereon. A 500 nm high metal film, e.g., Al—Si—Cu film 13 is formed on the insulating film 12 by sputtering or evaporation. Then, as shown in FIG. 2B, photoresist is applied to the Al—Si—Cu film 13, exposed, and then developed to form a resist pattern. The Al—Si—Cu film 13 is subjected to RIE using chlorine-based gas with the resist pattern serving as a mask, thereby forming a desired metallic wiring pattern 14. As shown in FIG. 2C, an SiN film or passivation film 15 is formed on the wiring pattern 14 by CVD to a thickness of 1,000 nm. As shown in FIG. 2D, a photosensitive polyimide precursor solution is dropped onto the SiN film 15 by spin. As a result, the solution is spread over the entire surface of the substrate 11 and forms a polyimide film 16 having a desired thickness, e.g., 20,000 nm.

Figure 2E:
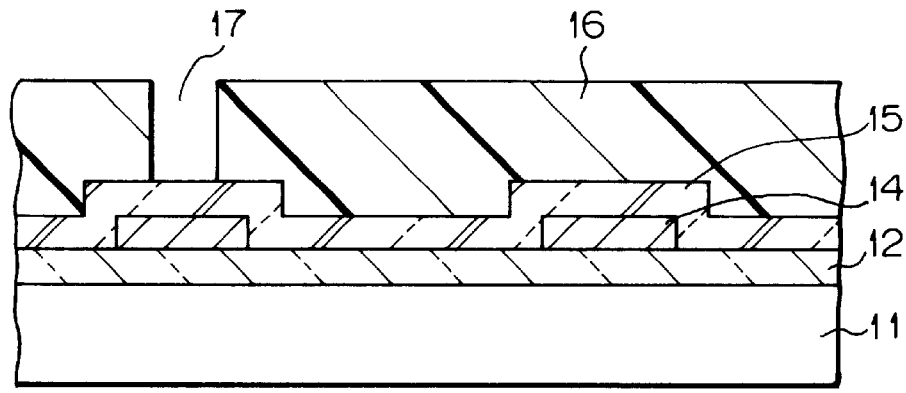
Figure 2F:
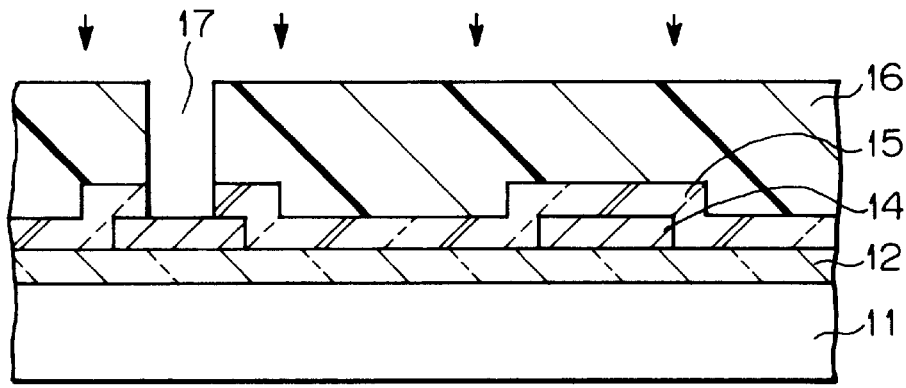
Figure 2G:
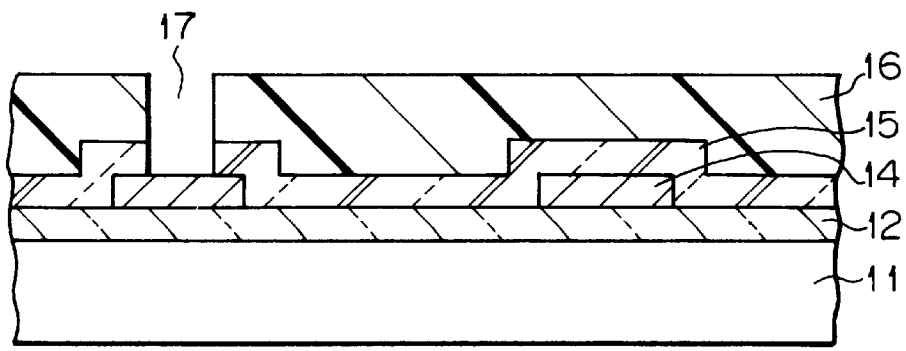

As shown in FIG. 2E, the polyimide film 16 is exposed, developed, and then patterned to form an opening 17 in the portion of the substrate 11 corresponding to a scribe line and a pad. Subsequently, as shown in FIG. 2F, RIE is conducted using $CF_4$—$O_2$ gas mixture or similar fluorine-based gas mixture to etch the SiN film 15 through the polyimide pattern or mask 16. Then, the surface of the substrate 11 is ashed by oxygen plasma under optimal conditions, i.e., by a power of 100 W to 1,000 W for 10 minutes to 30 minutes. Thereafter, as shown in FIG. 2G, the polyimide film 16 is hardened by heat under optimal conditions, i.e., at 300° C. to 400° C. for 60 minutes to 120 minutes.

Finally, the semiconductor device or wafer is separated into chips along the scribe line . After each chip has been adhered to a lead frame, the bonding pads and lead frame are connected together. Then, the entire assembly is sealed in a mold resin.

As stated above, the embodiment patterns the polyimide film 16, then etches the SiN film 15, and then ashes the substrate 11 by oxygen plasma. Therefore, even when fluorine ions used for etching are left on the surface of the polyimide film 16, they are removed by the oxygen ashing together with polyimide. This protects the wiring pattern 14 from corrosion ascribable to fluorine ions. In addition, the heat treatment following the ashing allows the imide coupling of the polyimide film 16 dissociated by the ashing to be set up again. It follows that the tight contact between the polyimide film 16 and the mold resin is insured and prevents moisture from entering through their interface. The semiconductor device is therefore highly moistureproof.

Figure 3A:
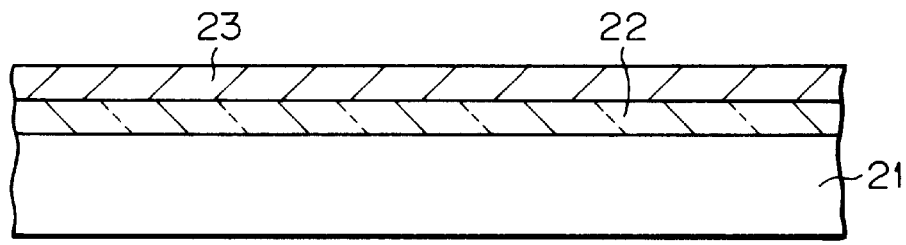
FIGS. 3A–3G are sections showing an alternative embodiment of the present invention.
Figure 3B:
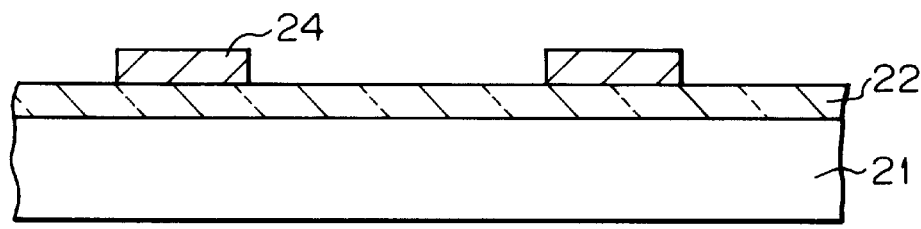
Figure 3C:
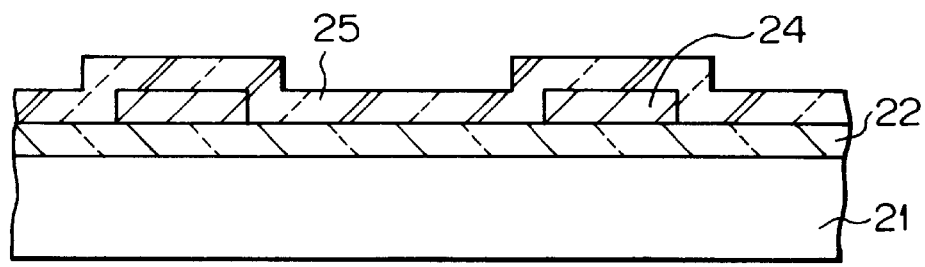
Figure 3D:
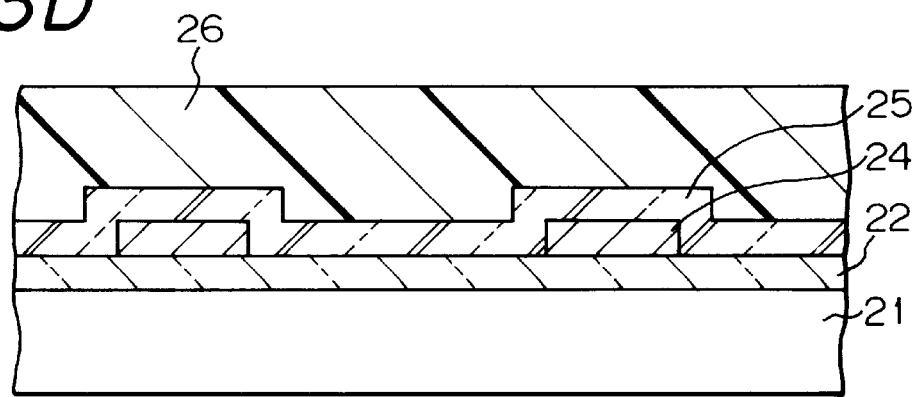

Referring to FIGS. 3A–3G, a second embodiment of the present invention is shown. First, as shown in FIG. 3A, an insulating film or ground layer 22 is formed on a semiconductor substrate 21 made of Si and formed with devices thereon. A 500 nm high metal film, e.g., Al—Si—Cu film 23 is formed on the insulating film 22 by sputtering or evaporation. As shown in FIG. 3B, photoresist a is applied to the Al—Si—cu film 23 by spin coating, exposed, and then developed to form a resist pattern. Then, RIE using chlorine-based gas is effected with the resist pattern serving as a mask, thereby forming a metallic wiring pattern 24. Subsequently, as shown in FIG. 3C, a passivation film, e.g., SiN film 25 is formed on the wiring pattern 24 by CVD. As shown in FIG. 3D, a photosensitive polyimide precursor solution is dropped onto the SiN film 25 by spin coating. As a result, the solution is spread over the entire surface of the substrate 21 to turn out a polyimide film 26 having a desired thickness, e.g., 20,000 nm.

Figure 3E:
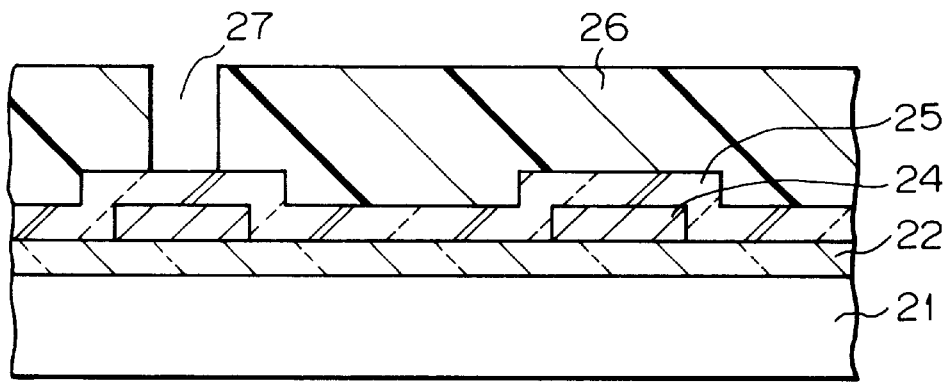
Figure 3F:
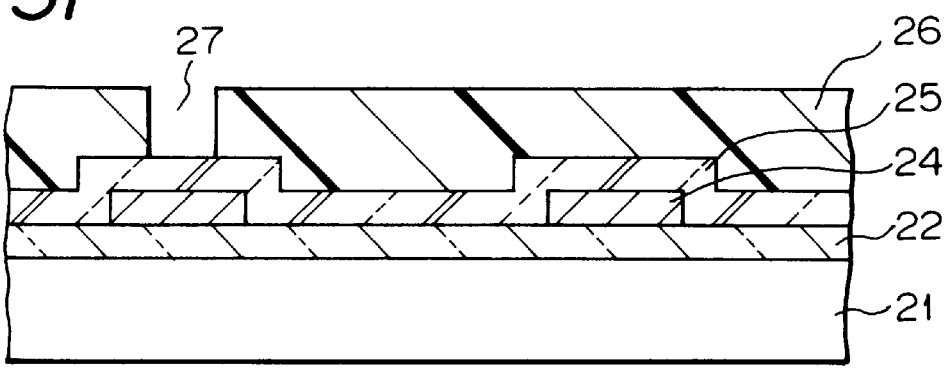
Figure 3G:
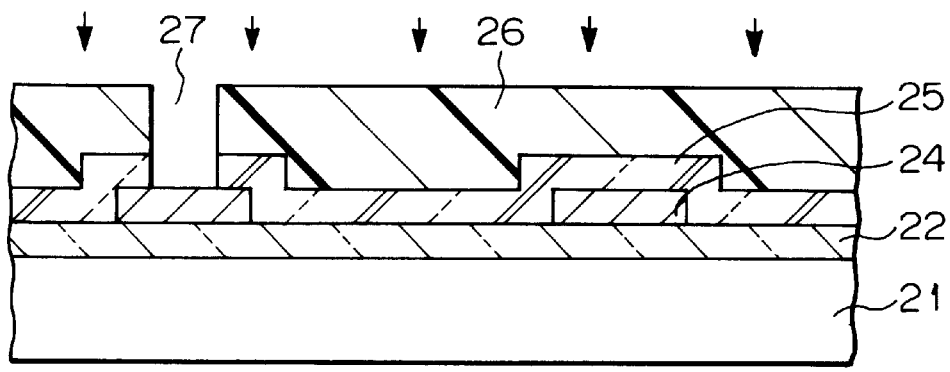

As shown in FIG. 3E, the polyimide film 26 is exposed, developed and then patterned to form an opening 27 in a portion corresponding to a scribe line and pads. Thereafter, as shown in FIG. 3F, a solvent contained in the polyimide film 26 is evaporated by a first heat treatment under optimal conditions, e.g., at 130° C. to 170° C. for 30 minutes to 60 minutes. Then, the SiN film 25 is patterned by RIE using $CF_4$—$O_2$ or similar fluorine-based gas mixture with the polyimide pattern serving as a mask. Subsequently, as shown in FIG. 3G, the surface of the substrate 21 is ashed by oxygen plasma under optimal conditions, i.e., by a power of 100 W to 1,000 W for 10 minutes to 30 minutes. Further, the polyimide film 26 is hardened by second heat treatment under optimal conditions, i.e., at 300° C. to 400° C. for 10 minutes to 30 minutes. After the substrate or wafer 21 has been separated into chips, the chips are each adhered to a lead frame. The pads formed on the chip is connected to the lead frame. Finally, the entire assembly is sealed in a mold resin.

This embodiment, like the first embodiment, patterns the polyimide film 26, etches the SiN film 25, and then ashes the surface of the substrate 21 by oxygen ashing. This procedure successfully removes fluorine ions together with polyimide and thereby protects the writing pattern 24 from corrosion. Further, the heat treatment following the ashing allows the imide coupling of the polyimide film 26 dissociated by the ashing to be set up again, so that the film 26 can tightly adhere to the mold resin. In addition, the etching is preceded by the baking for evaporating the solvent of the polyimide film 26. Consequently, degassing during the course of etching is reduced to, in turn, more stabilize the etching atmosphere and thereby insures the reproducibility of an etcher. In addition, parts built in the etcher are effected little.

Figure 4:
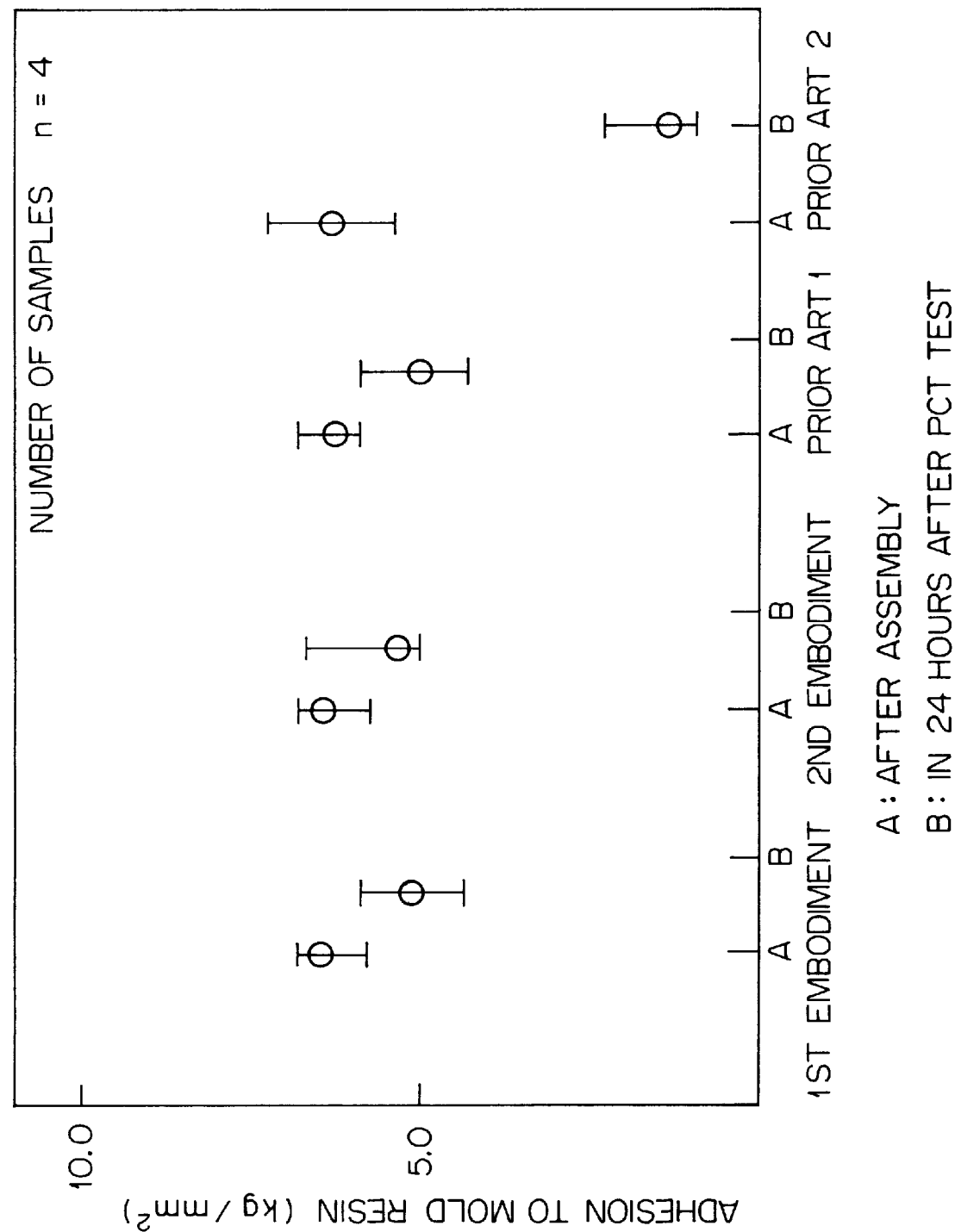
FIG. 4 plots adhesion strength achievable with the present invention verses adhesion strength of the prior art.

For comparison, there were prepared samples produced by the first embodiment, samples produced by the second embodiment, samples produced by a procedure in which etching followed a step of baking a polyimide film (referred to as Prior Art 1), and samples produced by a procedure in which oxygen ashing was added to Prior Art 1 after baking (referred to as Prior Art 2). FIG. 4 plots the polyimide-mold adhesion strengths of the above samples. Table 1 shown below lists the results of evaluation of the samples as to peeling at the interface between the polyimide and the mold resin. Table 2 also shown below lists the results of evaluation of the samples as to the corrosion of the portions where Al is exposed to the outside.

As shown in FIG. 4, the samples of the first and second examples and the samples of Prior Art 1 each only slightly decreased in adhesion strength on the elapse of 24 hours after a high-temperature high-humidity acceleration test (PCT test) effected at a temperature of 125° C. and a pressure of 2.0 kgf/$cm^2$ in a saturation mode. However, the samples of Prior Art 2 showed a noticeable decrease in adhesion strength after the PCT test. Regarding peeling at the polyimide and mold interface, as shown in Table 1, scanning acoustic tomography (SAT) showed that the samples of the first and second examples and the samples of Prior Art 1 did not peel when subjected to a thermal shock and moisture absorption test (referred to as wafer processing A). However, many of the samples of Prior Art 2 peeled after the wafer processing A.

As shown in Table 2, the samples of the first and second embodiments and the samples of Prior Art 2 did not show any Al corrosion in 500 hours after a PCT test effected at a temperature of 125° C. and a pressure of 2.0 kgf/$cm^2$. By contrast, 85% of the samples of Prior Art 1 showed Al corrosion in only 100 hours after the PCT test.

The photosensitive polyimide used in the first and second embodiments may be replaced with nonphotosensitive polyimide, if desired. Even with nonphotosensitive polyimide, it is possible to achieve the above advantages only if a polyimide pattern is formed through a mask implemented by a photoresist.

TABLE 1

| Process | Number of Peeled Samples | |
|---|---|---|
| | Before Processing | After Wafer Processing A |
| 1st Embodiment | 0/30 | 0/30 |
| 2nd Embodiment | 0/30 | 0/30 |
| Prior Art 1 | 0/30 | 0/30 |
| Prior Art 2 | 0/30 | 28/30 |

TABLE 2

| Process | Duration of PCT Test (Hours) | | | | | |
|---|---|---|---|---|---|---|
| | Before Test | 100 | 200 | 300 | 400 | 500 |
| 1st Embodiment | 0% | 0% | 0% | 0% | 0% | 0% |
| 2nd Embodiment | 0% | 0% | 0% | 0% | 0% | 0% |
| Prior Art 1 | 0% | 85% | 100% | | | |
| Prior Art 2 | 0% | 0% | 0% | 0% | 0% | 0% |

In summary, a method in accordance with the present invention patterns a polyimide film, etches an insulating film or passivation film by using the resulting polyimide pattern as a mask, and then ashes the polyimide pattern by oxygen plasma to thereby obviate the influence of an etchant used for etching. Therefore, the method is capable of reducing the corrosion of portions where a metallic wiring pattern is exposed to the outside. Because the oxygen ashing step is followed by heat treatment, the influence of oxygen which would lower the adhesion strength between the polyimide pattern and a mold resin is eliminated. As a result, the tight adhesion of the polyimide pattern to the mold resin is enhanced.

Further, when first heat treatment is effected after the patterning of the polyimide film, a solvent in the polyimide film is evaporated. This reduces degassing in the event of the etching of the passivation film which immediately follows the first heat treatment.

Various modifications will become possible for those skilled in the art after receiving the teachings of the present disclosure without departing from the scope thereof.

What is claimed is:

1. A method of producing a semiconductor device comprising the steps in sequence of:

(a) forming a metallic wiring pattern on a semiconductor substrate;

(b) forming an insulating film on said metallic wiring pattern;

(c) forming a polyimide film on said insulating film;

(d) patterning said polyimide film to thereby form a polyimide pattern;

(e) subjecting said polyimide pattern to a first heat treatment of 130° C. to 170° C. to evaporate any solvent contained in said polyimide film;

(f) selectively etching said insulating film by using said polyimide pattern as a mask;

(g) following step (f), oxygen ashing a surface of said polyimide pattern by oxygen plasma; and (h) following step (g), subjecting said polyimide pattern to a second heat treatment of 300° C. to 400° C. to harden said polyimide whereby to reform imide coupling dissociated by the oxygen ashing step.

2. A method as claimed in claim 1, wherein said insulating film comprises a silicon nitride film serving as a passivation film.

3. A method as claimed in claim 2, wherein a fluorine-based gas mixture is used to selectively etch said insulating film.

4. A method as claimed in claim 1, wherein step (c) comprises spin coating a polyimide precursor solution onto said semiconductor substrate to thereby form said polyimide film.

5. A method as claimed in claim 1, further comprising following step (g), the steps in sequence of:

(h) separating said semiconductor substrate into chips; and (i) adhering each chip to a lead frame;

(j) thereafter sealing each of said chips with a mold resin.

6. A method as claimed in claim 1, wherein said polyimride is hardened by heating at 300° C. to 400° C. for 60 minutes to 120 minutes.

* * * * *